(12) United States Patent
Ando et al.

(10) Patent No.: US 8,716,118 B2
(45) Date of Patent: May 6, 2014

(54) REPLACEMENT GATE STRUCTURE FOR TRANSISTOR WITH A HIGH-K GATE STACK

(75) Inventors: Takashi Ando, Tuckahoe, NY (US); Eduard A. Cartier, New York, NY (US); Unoh Kwon, Fishkil, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 13/345,295

(22) Filed: Jan. 6, 2012

(65) Prior Publication Data

US 2013/0175630 A1    Jul. 11, 2013

(51) Int. Cl.
   *H01L 21/3205* (2006.01)

(52) U.S. Cl.
   USPC ............... 438/591; 438/216; 257/E21.202

(58) Field of Classification Search
   CPC ............ H01L 29/517; H01L 21/823857; H01L 29/66545; H01L 29/66871; H01L 29/66628; H01L 29/66636
   USPC ................ 438/197, 199, 216, 183, 591; 257/E21.202
   See application file for complete search history.

(56) References Cited

U.S. PATENT DOCUMENTS

| 7,381,608 B2 * | 6/2008 | Brask et al. ............ 438/216 |
| 7,754,594 B1 | 7/2010 | Chudzik et al. |
| 7,820,552 B2 | 10/2010 | Kanakasabapathy et al. |
| 2006/0121678 A1 | 6/2006 | Brask et al. |
| 2013/0175630 A1 * | 7/2013 | Ando et al. ............ 257/368 |

OTHER PUBLICATIONS

Kesapragada, S., et al., "High-k/Metal Gate Stacks in Gate First and Replacement Gate Schemes," IEEE Advanced Semiconductor Manufacturing Conference 2010, pp. 256-259.

Narayanan, V., et al., "Band-Edge High-Performance High-k/Metal Gate n-MOSFETs Using Cap Layers Containing Group IIA and IIIB Elements with Gate-First Processing for 45 nm and Beyond," IEEE Symposium on VLSI Technology Digest of Technical Papers, 2006.

Han, I-S, et al., "Time-Dependent Dielectric Breakdown of $La_2O_3$-Doped High-k/Metal," IEEE Electron Device Letters, vol. 30, No. 3, Mar. 2009, pp. 298-301.

Mistry, K., et al., A 45nm Logic Technology with High-k + Metal Gate Transistors, Strained Silicon, 9 Cu Interconnect Layers, 193 nm Dry Patterning, and 100% Pb-free Packaging, IEEE 2007, pp. 247-250.

Choi, K., et al., "Extremely Scaled Gate First High-k/Metal Gate Stack with EOT of 0.55 nm Using Novel Interfactial Layer Scavenging Techniques for 22 nm Technology Node and Beyond," 2009 Symposium on VLIS Technology Digest of Technical Papers, pp. 138-139.

(Continued)

*Primary Examiner* — Jack Chen
(74) *Attorney, Agent, or Firm* — Stephen Bongini; Fleit Gibbons Gutman Bongini & Bianco PL

(57) ABSTRACT

A transistor includes a semiconductor layer and a gate structure located on the semiconductor layer. The gate structure includes a first dielectric layer. The first dielectric layer includes a doped region and an undoped region below the doped region. A second dielectric layer is located on the first dielectric layer, and a first metal nitride layer is located on the second dielectric layer. The doped region of the first dielectric layer comprises dopants from the second dielectric layer. Source and drain regions in the semiconductor layer are located on opposite sides of the gate structure.

9 Claims, 6 Drawing Sheets

(56) References Cited

OTHER PUBLICATIONS

Chang, S.Z., et al., "Electrical Properties of Low-Vt Metal-Gated n-MOSFETs Using La2O3/SiOc as Interfacial Layer Between HfLaO High-k Dielectrics and Si Channel," IEEE Electron Device Letters, vol. 29, No. 5, May 2008, pp. 430-433.

Auth, C., "45nm High-k + Metal Gate Strain-Enhanced CMOS Transistors," IEEE CICC 2008.

* cited by examiner

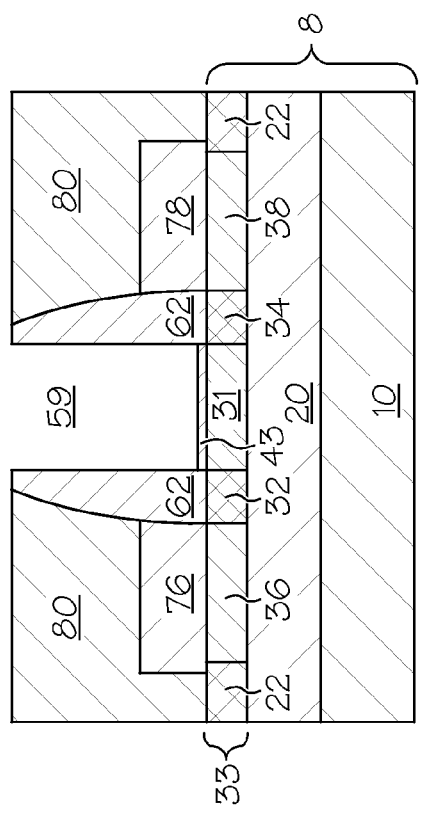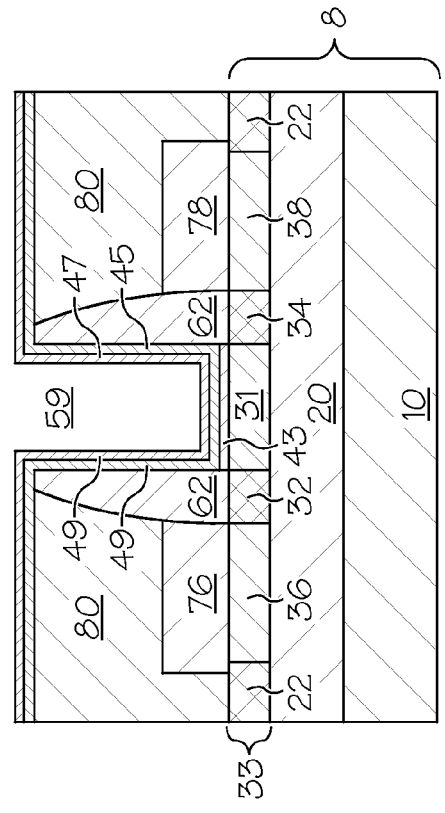

REPLACEMENT GATE STRUCTURE FOR TRANSISTOR WITH A HIGH-K GATE STACK

FIELD OF THE INVENTION

The present invention generally relates to the field of semiconductors, and more particularly relates to a metal-oxide-semiconductor filed effect transistor (MOSFET) having a high-k gate stack.

BACKGROUND OF THE INVENTION

Scaling of the gate dielectric is a challenge in improving the performance of advanced field effect transistors. In a field effect transistor employing a silicon oxide-based gate dielectric, the leakage current through the gate dielectric increases exponentially with the decrease in the thickness of the gate dielectric. Such devices have too high of a leakage current to provide high performance when the silicon oxide gate dielectric has a thickness of 1.1 nm or less.

SUMMARY OF THE INVENTION

In one embodiment a method for fabricating a transistor is disclosed. According to the method, a disposable gate structure is formed on a semiconductor substrate. The disposable gate structure is removed so as to form a gate cavity. A first dielectric layer is formed in the gate cavity, and a second dielectric layer is formed in the gate cavity. A first metal nitride layer is formed on the second dielectric layer.

In another embodiment, a transistor is disclosed. The transistor includes a semiconductor layer and a gate structure located on the semiconductor layer. The gate structure includes a first dielectric layer that includes a doped region and an undoped region below the doped region. A second dielectric layer is located on the first dielectric layer. A first metal nitride layer is located on the second dielectric layer. The doped region of the first dielectric layer comprises dopants from the second dielectric layer. Source and drain regions in the semiconductor layer are located on opposite sides of the gate structure.

In yet another embodiment, an integrated circuit is disclosed. The integrated circuit includes transistors. At least one of the transistors includes a semiconductor layer and a gate structure located on the semiconductor layer. The gate structure includes a first dielectric layer that includes a doped region and an undoped region below the doped region. A second dielectric layer is located on the first dielectric layer, and a first metal nitride layer is located on the second dielectric layer. The doped region of the first dielectric layer comprises dopants from the second dielectric layer. Source and drain regions in the semiconductor layer are located on opposite sides of the gate structure.

BRIEF DESCRIPTION OF THE DRAWINGS

FIG. 3 is a cross-sectional view of the semiconductor structure after the disposable gate structure has been removed according to the first embodiment of the present invention;

FIG. 4 is a cross-sectional view of the semiconductor structure after first and second dielectric layers have been deposited according to the first embodiment of the present invention;

DETAILED DESCRIPTION

Figure 1:
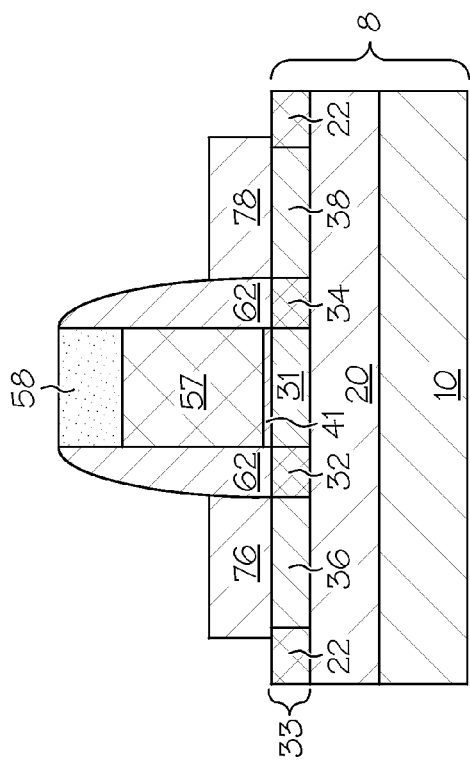
FIG. 1 is a cross-sectional view of a semiconductor structure after a disposable gate structure and raised source/drain regions have been formed on a semiconductor substrate according to a first embodiment of the present invention.

FIGS. 1 to 8 illustrate a process for forming a semiconductor device having a high-k gate stack using a disposable gate structure (also referred to as a "replacement gate structure" or a "dummy gate structure") according to one embodiment of the present invention. FIGS. 1 to 8 each show a cross-sectional view of a semiconductor device during the fabrication process. This process is applicable to both nFET and pFET devices unless otherwise noted. FIG. 1 shows a semiconductor structure that includes a semiconductor substrate 8, which in this embodiment is a semiconductor-on-insulator (SOI) substrate made up, from bottom to top, of a handle substrate 10, a buried insulator layer 20, and an upper semiconductor layer 33.

The handle substrate 10 of this embodiment is a semiconductor substrate comprising a single crystalline semiconductor material such as single crystalline silicon, a polycrystalline semiconductor material, an amorphous semiconductor material, or a stack thereof. The thickness of the handle substrate 10 is from 50 microns to 1,000 microns, although lesser and greater thicknesses are employed in further embodiments. The buried insulator layer 20 includes a dielectric material such as silicon oxide, silicon nitride, silicon oxynitride, or a combination thereof. The thickness of the buried insulator layer 20 is from 50 nm to 500 nm, although lesser and greater thicknesses are employed in further embodiments. The thickness of the upper semiconductor layer 33 is from 3 nm to 60 nm, and typically from 5 nm to 10 nm, although lesser and greater thicknesses are employed in further embodiments.

The upper semiconductor layer 33 includes various single crystalline semiconductor portions that include, in this exemplary embodiment, a body region 31, a source extension region 32, a drain extension region 34, a planar source region 36, and a planar drain region 38. Shallow trench isolation structures 22 are formed in the upper semiconductor layer 33 through a conventional fabrication method. For example, the shallow trench isolation structures 22 can be formed by making trenches extending from the top surface of the upper semiconductor layer 33 at least to the top surface of the buried insulator layer 20, filling the trenches with a dielectric material, and removing excess dielectric material from above the top surface of the upper semiconductor layer 33.

The various single crystalline semiconductor portions (31, 32, 34, 36, and 38) in the upper semiconductor layer 33 are formed by introducing dopants (such as B, Ga, In, P, As, and/or Sb) by ion implantation, plasma doping, and/or gas phase doping using various known masking structures. Before implanting dopants into the various portions of the upper semiconductor layer 33, a disposable gate stack structure is formed. The disposable gate stack structure of this embodiment includes a vertical stack, from bottom to top, of a disposable gate dielectric 41, a disposable gate material portion 57, and a disposable gate cap dielectric 58.

The disposable gate dielectric 41 is a dielectric material that can function as an etch stop layer during subsequent removal of the disposable gate material portion 57. For example, the disposable gate dielectric 41 can be silicon oxide, silicon nitride, silicon oxynitride, or a combination thereof. The disposable gate material portion 57 is a material that can be removed selectively with respect to the disposable gate dielectric 41 and a gate spacer 62, such as a dielectric material (e.g., silicon oxide, silicon nitride, silicon oxynitride, or a combination thereof). The disposable gate cap dielectric 58 is a dielectric material that can be removed selectively with respect to the gate spacer 62. For example, the disposable gate dielectric 41 and the gate spacer 62 can be silicon oxide, and the disposable gate cap dielectric 58 can be silicon nitride, or vice versa. The thickness of the disposable gate stack structure 41, 57, and 58 is from 50 nm to 500 nm, although lesser and greater thicknesses are employed in further embodiments.

The source extension region 32 and the drain extension region 34 are formed, in this exemplary embodiment, by introducing dopants into exposed portions of the upper semiconductor layer 33, employing the disposable gate stack structure 41, 57, and 58 as a masking layer. The body portion 31 has a doping of a first conductivity type, while the source extension region 32 and the drain extension region 34 have a doping of a second conductivity type, which is the opposite of the first conductivity type.

The gate spacer 62 is a dielectric material such as silicon oxide, silicon nitride, silicon oxynitride, or a combination thereof. The gate spacer 62 is formed, in this embodiment, by deposition of a conformal dielectric material layer and an anisotropic etch that removes horizontal portions of the conformal dielectric material layer. The remaining vertical portions of the conformal dielectric material layer constitute the gate spacer 62. The thickness of the gate spacer 62, as measured at the base that contacts the upper semiconductor layer 33, is from 10 nm to 120 nm, and typically from 20 nm to 60 nm, although lesser and greater thicknesses are employed in further embodiments.

The source region 36 and the drain region 38 are formed, in this embodiment, by introducing dopants into exposed portions of the upper semiconductor layer 33, employing the combination of the disposable gate stack structure 41, 57, and 58 and the gate spacer 62 as a masking layer. The source region 36 and the drain region 38 have the same type of doping as the source extension region 32 and the drain extension region 34.

A raised source region 76 and a raised drain region 78 are formed, in this embodiment, by selective epitaxy of a semiconductor material. In this embodiment, the raised source region 76 and the raised drain region 78 are in-situ doped during the selective epitaxy with dopants of the same conductivity type as the source region 36 and the drain region 38. In another embodiment, the raised source region 76 and the raised drain region 78 are formed as intrinsic semiconductor portions, and are subsequently doped with dopants of the same conductivity type as the source region 36 and the drain region 38. The thickness of the raised source region 76 and the raised drain region 78 is from 2 nm to 200 nm, and typically from 5 nm to 80 nm, although lesser and greater thicknesses are employed in further embodiments.

Figure 2:
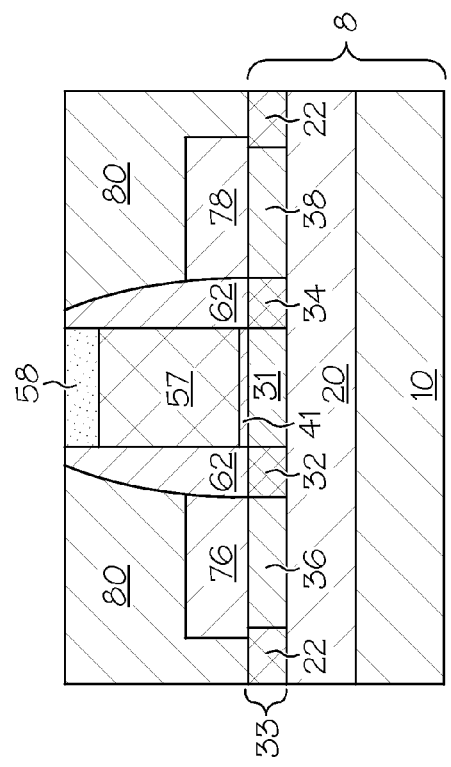
FIG. 2 is a cross-sectional view of the semiconductor structure after formation of a planarization layer has been formed according to the first embodiment of the present invention.

As shown in FIG. 2, a planarization dielectric layer 80 is deposited over the device by chemical vapor deposition (CVD). The planarization dielectric layer 80 is a dielectric material such as silicon oxide, silicon nitride, silicon oxynitride, or a combination thereof. The planarization dielectric layer 80 is subsequently planarized so that a planar top surface of the planarization dielectric layer 80 is coplanar with a planar top surface of the disposable gate cap dielectric 58 and a planar top surface of the dielectric spacer 62.

In this embodiment, the planarization dielectric layer 80 is a dielectric material that is different from the dielectric material of the disposable gate cap dielectric 58. The disposable gate cap dielectric 58 is employed as a stop layer during the planarization of the planarization dielectric layer 80 by chemical mechanical planarization (CMP).

As shown in FIG. 3, the disposable gate stack structure 41, 57, and 58 is then removed selectively with respect to the planarization dielectric layer 80 and the gate spacer 62. This forms a gate cavity 59 that is laterally surrounded by the gate spacer 62. The inner sidewalls, which can be vertical sidewalls, of the gate spacer 62 are exposed by formation of the gate cavity 59.

Further, the top surface of the body portion 31 of the upper semiconductor layer 33 is exposed at the bottom of the gate cavity 59. Optionally, an interfacial layer 43 is formed on the exposed surface of the body portion 31 by conversion of a surface portion of the semiconductor material in the body portion 31 into a dielectric material. For example, the body portion 31 can be single crystalline silicon, and the interfacial layer 43 can be silicon oxide which is formed by thermal oxidation, chemical oxidation, or plasma oxidation of the surface portion of the silicon in the body portion 31. The thickness of the interfacial layer is from 0.5 nm to 1.5 nm, although lesser and greater thicknesses are employed in further embodiments.

A conventional thermal growing technique such as oxidation or oxynitirdation is used to form the interfacial layer 43 in this embodiment. When the exposed body portion 31 is an Si-containing material, the interfacial layer 43 is comprised of silicon oxide, silicon oxynitride, or a nitrided silicon oxide. When the exposed body portion 31 is other than an Si-containing semiconductor material, the interfacial layer 43 is a semiconductor oxide, a semiconducting oxynitride, or a nitrided semiconducting oxide. The thickness of the interfacial layer is typically from 0.1 nm to 1.5 nm, with a thickness from 0.5 to 1.2 nm being even more typical. The thickness, however, may be different after processing at higher temperatures, which are usually required during device fabrication.

In one embodiment of the invention, the interfacial layer 43 is a silicon oxide layer having a thickness from 0.5 nm to 0.8 nm that is formed by a wet chemical oxidation. In this wet chemical oxidation, a cleaned surface of a semiconductor material (such as an HF-last semiconductor surface) is treated with a mixture of ammonium hydroxide, hydrogen peroxide and water (in a 1:1:5 ratio) at 65 degrees C. Alternatively, the interfacial layer 43 can be formed by treating the HF-last semiconductor surface in ozonated aqueous solutions, with the ozone concentration usually varying from 2 to 40 ppm (parts per million).

First and second dielectric layers 45 and 47 are sequentially deposited in the gate cavity 59 and over a top surface of the planarization dielectric layer 80, as shown in FIG. 4. The first and second dielectric layers 45 and 47 are collectively referred to as the "gate dielectric layer" 49. The first dielectric layer 45 is a first high dielectric constant (high-k) dielectric layer having a dielectric constant greater than 8.0. The first high-k gate dielectric layer 45 is deposited directly on the inner sidewalls of the gate spacer 62 and the top planar surface of the planarization dielectric layer 80. If the gate spacer 62 includes a top planar surface, the first high-k gate dielectric layer 45 is formed directly on the top planar surface of the gate spacer 62. If an interfacial layer 43 is present, a lower portion of the first high-k gate dielectric layer 45 is formed directly on the top surface of the interfacial layer 43. If an interfacial layer 43 is not present, the lower portion of the first high-k gate dielectric layer 45 is formed directly on the top surface of the body portion 31.

The first high-k dielectric layer 45 is a dielectric metal oxide, which is a high-k material comprising a metal and oxygen (i.e., a high-k gate dielectric material). The dielectric metal oxide is deposited by a conventional process such as chemical vapor deposition (CVD), physical vapor deposition (PVD), molecular beam deposition (MBD), pulsed laser deposition (PLD), liquid source misted chemical deposition (LSMCD), atomic layer deposition (ALD), etc. In one embodiment, the first high-k gate dielectric layer 45 comprises $HfO_2$ or $ZrO_2$. However, other materials such as $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y2O_xN_y$, a silicate thereof, and an alloy thereof are applicable as well (each value of x is independently from 0.5 to 3 and each value of y is independently from 0 to 2). The thickness of the first high-k gate dielectric layer 45 is from 0.9 nm to 6 nm, and typically from 1.0 nm to 3 nm, although lesser and greater thicknesses are employed in further embodiments.

The second dielectric layer 47 is a second high-k dielectric layer 47. The second high-k dielectric layer 47 is over the first high-k dielectric layer 45. The second high-k dielectric layer 47 is a high-k gate dielectric material and is deposited by a similar process as that used for the first high-k dielectric layer 45. In one embodiment, the second high-k dielectric layer 47 comprises $La_2O_3$ or any other materials from Group IIA or IIIB of the periodic table.

An optional anneal can be performed to diffuse lanthanum atoms out of the second dielectric layer 47 of the U-shaped gate dielectric layer 49 and partially into the first dielectric layer 45 of the U-shaped gate dielectric layer 49. This results in an upper region (which is closer to the second dielectric layer 47) of a portion of the first dielectric layer 45 being doped with lanthanum atoms while a lower region (which is closer to the interfacial layer 43) of the portion is undoped. This allows for the gate leakage current to be suppressed without unnecessarily increasing the thickness of the $HfO_2$ or $ZrO_2$ in the first gate dielectric layer 45. Stated differently, the second dielectric layer 45 (e.g., comprising lanthanum oxide) provides a better equivalent-oxide-thickness (EOT)—gate leakage current trade-off than increasing HfO2 or ZrO2 thickness. Also, there is no hysteresis degradation experienced by adding the second dielectric layer 47, unlike that experienced by increasing the thickness of $HfO_2$ or $ZrO_2$. The anneal is performed in this embodiment at a temperature from 400° C. to 800° C. for a duration between 1 minute and 24 hours using a furnace anneal or a rapid thermal anneal (RTA).

Figure 5:
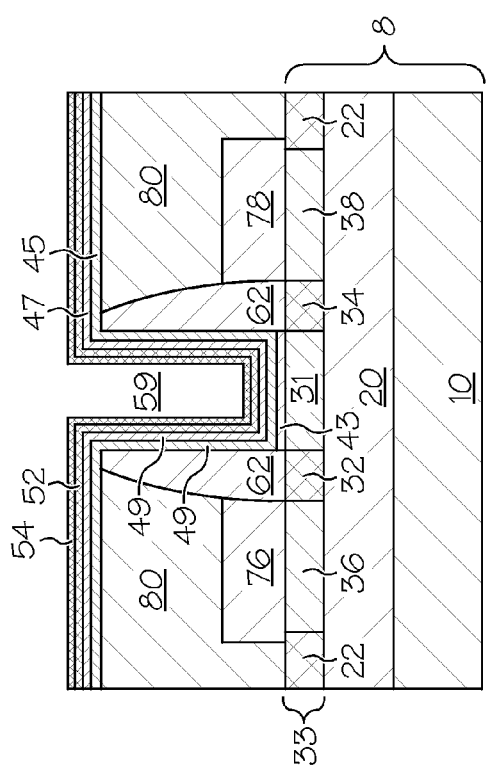
FIG. 5 is a cross-sectional view of the semiconductor structure after a first metal nitride material has been deposited on the second metal nitride layer according to the first embodiment of the present invention.

A first metal nitride layer 52 is deposited on the gate dielectric layer 49, as shown in FIG. 5. In this embodiment, the first metal nitride layer 52 is deposited on the second high-k dielectric layer 47 by chemical vapor deposition (CVD), physical vapor deposition (PVD), atomic layer deposition (ALD), or a combination thereof. The first metal nitride layer 52 is a conductive metal nitride material, such as titanium nitride, tantalum nitride, or tungsten nitride. The first metal nitride layer 52 more generally includes a metal element and nitrogen.

In one embodiment, the first metal nitride layer 52 is a stoichiometric metal nitride having the composition of TiN, TaN, or WN in which the atomic percentage of metal atoms is 50% and the atomic percentage of the nitrogen atoms is 50%. For example, the first metal nitride layer 52 can be stoichiometric titanium nitride (i.e., TiN in which the atomic percentage of titanium is 50% and the atomic percentage of nitrogen atoms is 50%).

The thickness of the first metal nitride layer 52, as measured directly above a horizontal portion of the second high-k dielectric layer 47 within the gate cavity 59 immediately after formation, is from 1.5 nm to 3.0 nm, although lesser and greater thicknesses are employed in further embodiments (this thickness is referred to as the "original thickness").

A second metal nitride layer 54 is formed over the first metal nitride layer 52, as shown in FIG. 5. The second metal nitride layer 54 also is a conductive metal nitride material, such as titanium nitride, tantalum nitride, or tungsten nitride. The second metal nitride layer 54 more generally includes a metal element and nitrogen. In this embodiment, the second metal nitride layer 54 comprises tantalum nitride (TaN). The second metal nitride layer 54 is formed on over the first metal nitride layer 52 layer.

Figure 6:
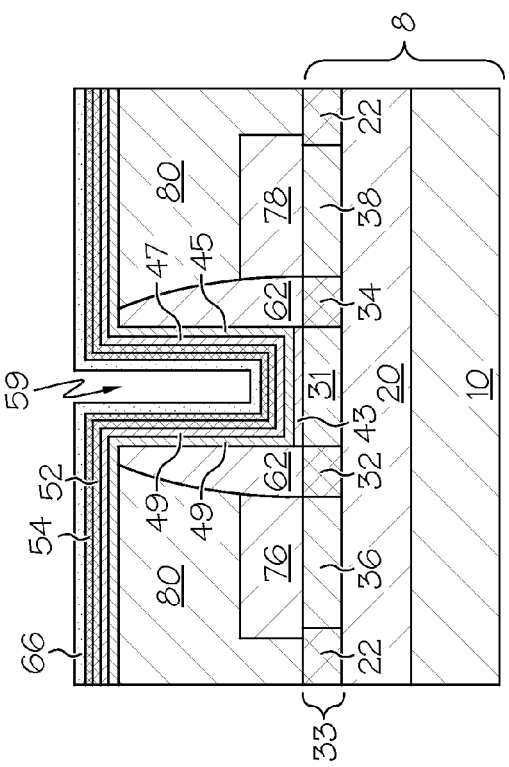
FIG. 6 is a cross-sectional view of a PFET semiconductor structure after a first work function metallic layer has been formed over the second metal nitride layer of a PFET device according to the first embodiment of the present invention.

After the second metal nitride layer 54 is formed, a first work function metallic layer 66 is then formed on the PFET device, as shown in FIG. 6. This first work function metallic layer 66 is formed over the second metal nitride layer 54 by chemical vapor deposition (CVD), atomic layer deposition (ALD), molecular beam epitaxy (MBE), pulsed laser deposition (PLD), liquid source misted chemical deposition (LSMCD), physical vapor deposition (PVD), or a combination thereof. The first work function metallic layer 66 optimizes the performance of a field effect transistor by tuning the work function of the gate electrode. In one embodiment, this first work function metallic layer 66 is a p-type work function material, such as TiN. Other metallic materials such as Pt, Rh, Ir, Ru, Cu, Os, Be, Co, Pd, Te, Cr, Ni, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, alloys thereof, conductive oxides thereof, conductive nitrides thereof, and any combinations of the foregoing can also be used in the first work function metallic layer 66.

In one embodiment, the formation of the first work function metallic layer 66 also forms a metallic layer on the NFET as well. In this embodiment, the metallic material deposited on the NFET device during formation of the first work function metallic layer 66 on the PFET device is removed using a conventional process.

Figure 7:
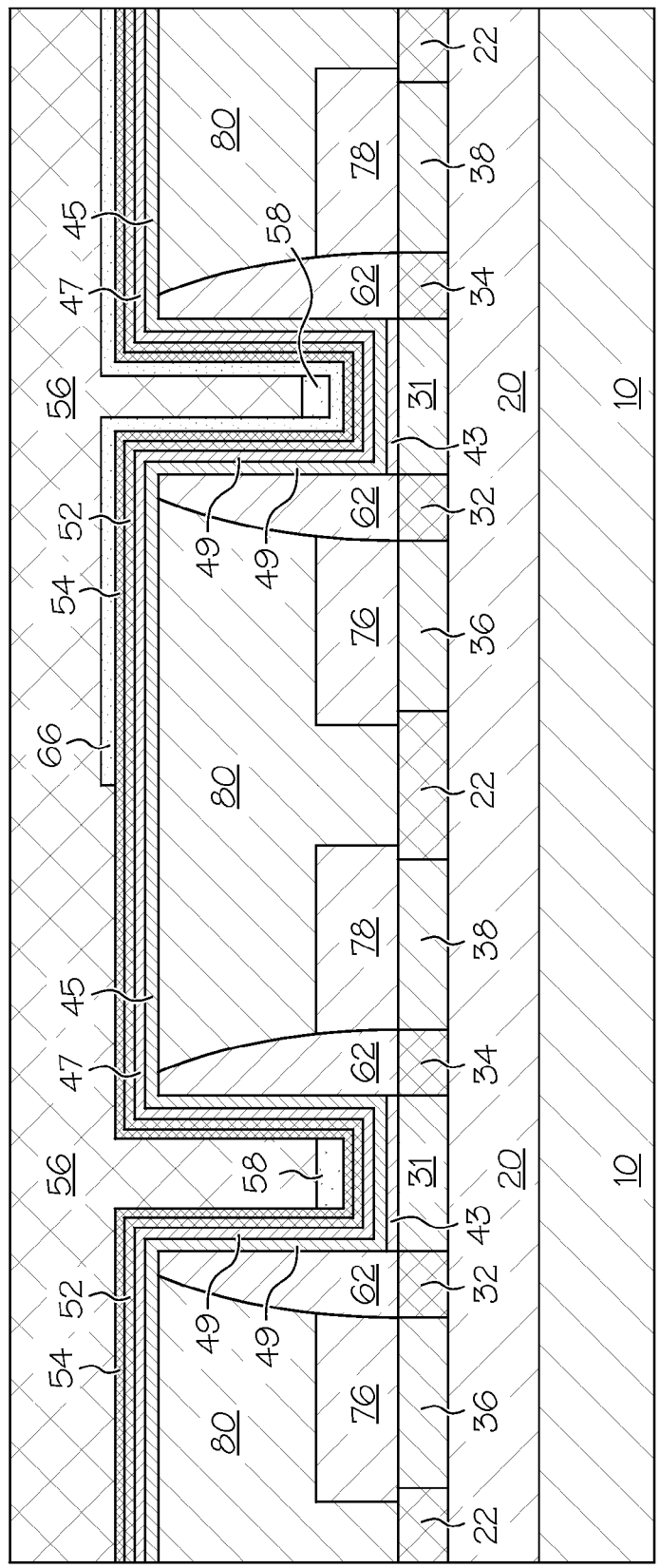
FIG. 7 is a cross-sectional view of a PFET semiconductor structure and an NFET semiconductor structure after a conductive material layer has been deposited in the gate cavity of both the PFET and NFET semiconductor structures according to the first embodiment of the present invention.

A conductive material layer 56 is deposited in the gate cavity 59 of both the NFET and PFET devices, over the top surface of the second metal nitride layer of the NFET device, and over the top surface of the first work function metallic layer 66 of the PFET device, as shown in FIG. 7. The conductive material layer 56 comprises a conductive material, which can be a doped semiconductor material, a metallic material, or a combination thereof. The doped semiconductor material, in one embodiment in which it is employed, is doped polysilicon, doped polycrystalline germanium, a doped silicon-germanium alloy, any other doped elemental, a compound semiconductor material, or a combination thereof. The metallic material is any metallic material that can be deposited by chemical vapor deposition (CVD), physical vapor deposition (PVD), or a combination thereof. For example, the metallic material can include aluminum and/or tungsten. The thickness of the conductive material layer 56 is selected to completely fill the gate cavity 59.

In one embodiment, the conductive material layer 56 includes a second work function metallic layer 58. The second work function metallic layer 58 is a metallic material that optimizes the performance of a field effect transistor by tuning the work function of the gate electrode. In this embodiment, the second work function metallic layer 58 for the nFET and pFET devices comprises a metallic material with an n-type work function such as TiAl. However, other metallic materials such as Pt, Rh, Ir, Ru, Cu, Os, Be, Co, Pd, Te, Cr, Ni, TiN, Hf, Ti, Zr, Cd, La, Tl, Yb, Al, Ce, Eu, Li, Pb, Tb, Bi, In, Lu, Nb, Sm, V, Zr, Ga, Mg, Gd, Y, alloys thereof, conductive oxides thereof, conductive nitrides thereof, and any combinations of the foregoing as also applicable.

Figure 8:
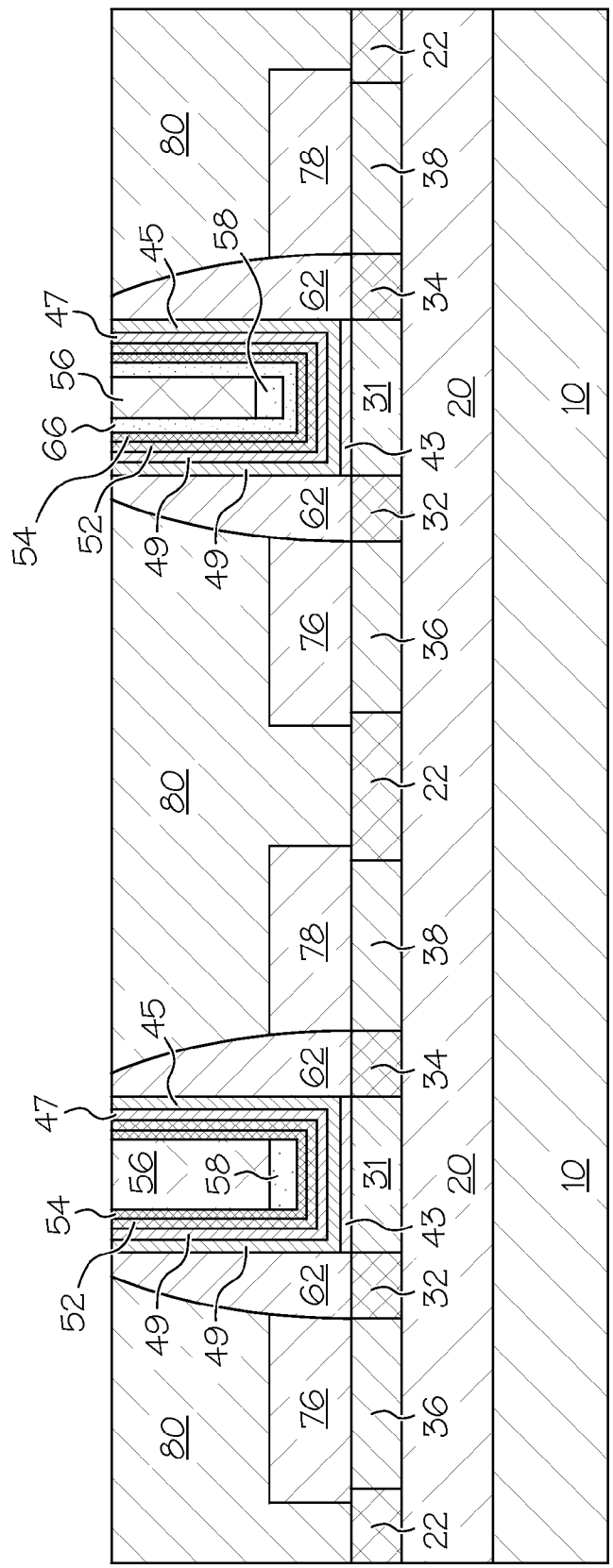
FIG. 8 is a cross-sectional view of a PFET semiconductor structure and an NFET semiconductor structure after gate materials have been removed from above a top surface of the planarization dielectric according to the first embodiment of the present invention.

The materials of the high-k gate dielectric layer 49, the first metal nitride layer 52, the second metal oxynitride layer 54, the first work function metallic layer 66, and the conductive material layer 56 including the second work function metallic layer 58 are collectively referred to as gate materials. As shown in FIG. 8, these gate materials are removed from above a top surface of the planarization dielectric layer 80 by planarization, which can be performed by chemical mechanical planarization (CMP), recess etch, or a combination thereof. Thus, the portions of the high-k gate dielectric layer 49, the first metal nitride layer 52, the second metal oxynitride layer 54, the first work function metallic layer 66, and the conductive material layer 56 including the second work function metallic layer 58 are removed from above the top surface of the planarization dielectric layer 80. The remaining portion of the high-k gate dielectric layer 49 constitutes a U-shaped gate dielectric 49, a remaining portion of the first metal nitride layer 52 constitutes a first U-shaped metal nitride layer 52, a remaining portion of the second metal nitride layer 54 constitutes a second U-shaped metal nitride layer 54, and a remaining portion of the conductive material layer 56 constitutes a conductive material portion 56. In addition, the remaining portion of the first work function metallic layer 66 of the pFET device constitutes a first work function metallic layer 66.

The first dielectric layer 45 of the U-shaped gate dielectric 49 includes a horizontal portion contacting the interfacial layer 43 or a top surface of the body portion 31, and vertical portions having vertical sidewalls that contact the gate spacer 62. The second dielectric layer 47 of the U-shaped gate dielectric 49 includes a horizontal portion contacting the horizontal portion of the first dielectric layer 45 of the U-shaped gate dielectric 49, and vertical portions contacting inner sidewalls of the first dielectric layer 45. The first U-shaped metal nitride layer 52 includes a horizontal portion contacting the horizontal portion of the second dielectric layer 47 of the U-shaped gate dielectric 49, and vertical portions contacting inner sidewalls of the second dielectric layer 47. The second U-shaped metal nitride layer 54 includes a horizontal portion contacting the horizontal portion of the first U-shaped metal nitride layer 52, and vertical portions contacting inner sidewalls of the first U-shaped metal nitride layer 52.

The conductive material portion 56 of the nFET device contacts the top surface of the horizontal portion of the second U-shaped metal nitride layer 54 and inner sidewalls of the second U-shaped metal nitride layer 54. The first work function metallic layer 66 of the pFET device includes a horizontal portion contacting the horizontal portion of the second U-shaped metal nitride layer 54, and vertical portions contacting inner sidewalls of the second U-shaped metal nitride layer 54. The conductive material portion 56 of the pFET device contacts the top surface of the horizontal portion of the first work function metallic layer 66 and inner sidewalls of the second first work function metallic layer 66.

The top surface of the U-shaped gate dielectric 49, the top surface of the first U-shaped metal nitride layer 52, the top surface of the second U-shaped metal nitride layer 54, the top surface of the conductive material portion 56, and the top surface of the work function metallic layer 66 are coplanar with the top surface of the planarization dielectric layer 80 after planarization. The first U-shaped metal oxide layer 52, the second U-shaped metal nitride layer 54, and the conductive material portion 56 (and any work function metallic layers 58 and 66) collectively constitute a gate electrode of a field effect transistor. The gate spacer 62 laterally surrounds the gate electrode. The gate spacer 62 has a top surface that is coplanar with the top surface of the planarization dielectric layer 80.

Conventional processes are then performed to complete the fabrication process. For example, in one embodiment a contact level dielectric material layer is deposited over the gate electrode and the planarization dielectric layer 80. The contact level dielectric material layer 90 is a dielectric material that can be employed for forming metal interconnect structures therein, such as silicon oxide, silicon nitride, silicon oxynitride, organosilicate glass, or a combination thereof. The contact level dielectric material layer 90 is deposited by chemical vapor deposition (CVD). The thickness of the contact level dielectric material layer 90 is from 50 nm to 500 nm, although lesser and greater thicknesses are employed in further embodiments.

Contact via holes are then formed in the contact level dielectric material layer and the planarization dielectric layer 80, and then filled with a conductive material to form various contact via structures. The various contact via structures include a gate contact via structure, a source contact via structure, and a drain contact via structure. Various metal semiconductor alloy portions are formed after formation of the various contact via holes and before formation of the various contact via structures by deposition of a metal layer, an anneal that induces reaction between the metal in the metal layer and underlying semiconductor materials, and removal of unreacted portions of the metal layer. The various metal semiconductor alloy portions include a gate metal semiconductor alloy portion, a source metal semiconductor alloy portion, and a drain metal semiconductor alloy portion.

Figure 9:
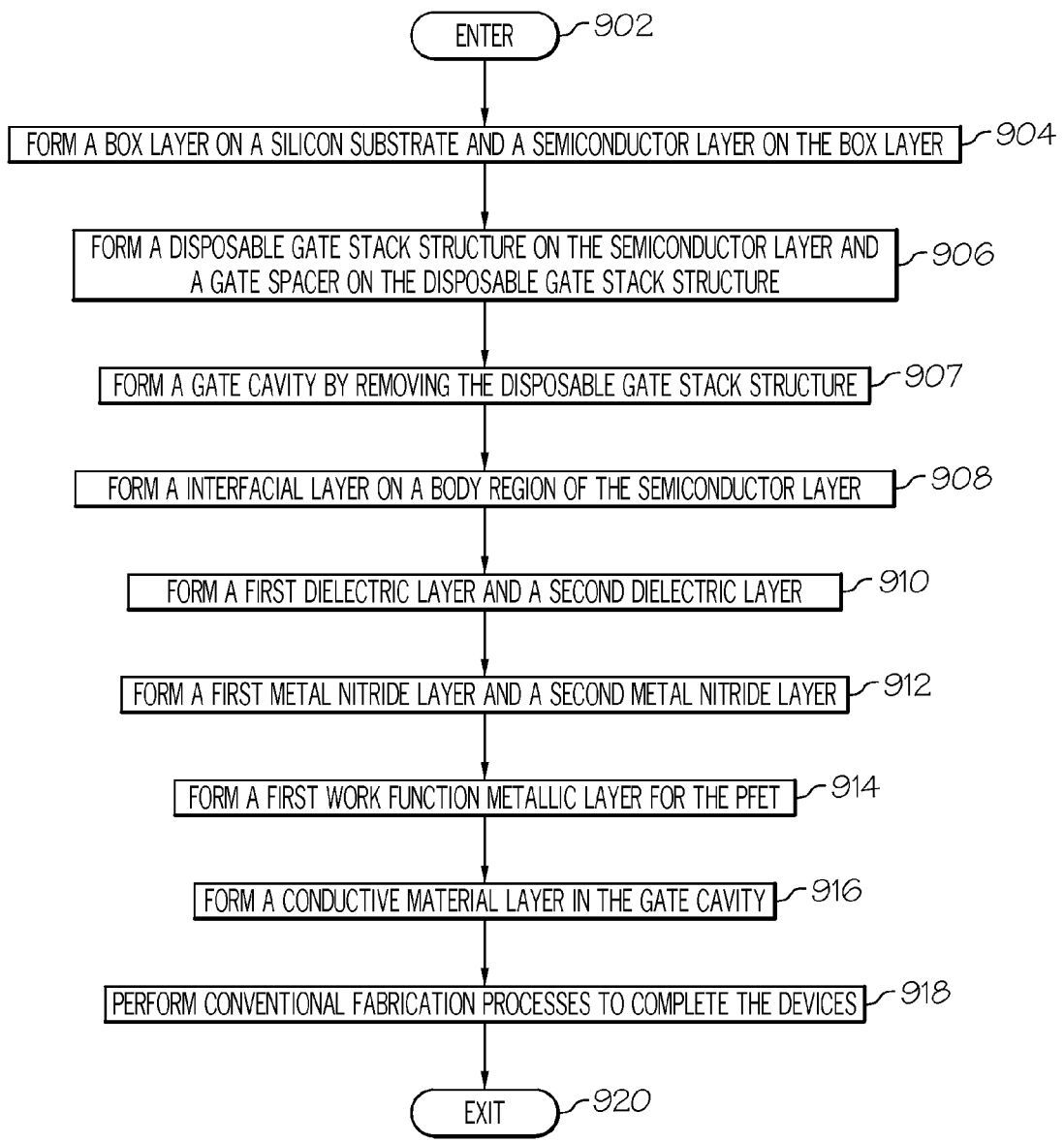
FIG. 9 is an operational flow diagram illustrating a process for forming a transistor with a high-k gate stack using a replacement gate structure according to one embodiment of the present invention.

FIG. 9 is an operational flow diagram illustrating a process for forming a transistor with a high-k stack using a replacement gate structure according to one embodiment of the present invention. A BOX layer is formed on a silicon substrate, and a semiconductor layer is formed on the BOX layer, at step 904. A disposable gate stack structure is formed on the semiconductor layer, and a gate spacer is formed on the disposable gate stack structure, at step 906. A gate cavity is formed by removing the disposable gate stack structure, at step 907.

An interfacial layer is formed on a body region of the semiconductor layer exposed by the gate cavity, at step 908. A first dielectric layer and a second dielectric layer are formed, at step 910. The first dielectric layer is formed on the inner sidewalls of the gate spacer and on the interfacial layer. The second dielectric layer is formed on the inner sidewalls and horizontal portion of the first dielectric layer. A first metal nitride layer and a second metal nitride layer are formed, at step 912. The first metal nitride layer is formed on the inner sidewalls of the second dielectric layer and horizontal portion of the second dielectric layer. The second metal nitride layer is formed on the inner sidewalls of the first metal nitride layer and horizontal portion of the second first metal nitride layer.

A first work function metallic layer for the pFET is formed on the inner sidewalls of the first metal nitride layer and horizontal portion of the first metal nitride layer, at step 914. A conductive material layer is deposited in the gate cavity of both the nFET and pFET devices, on the second metal nitride layer of the NFET device, and on the first work function metallic layer of the PFET device, at step 916. Conventional fabrication processes are then performed to complete the devices, at step 918. The control flow then exits at step 920.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for fabricating a transistor, the method comprising:
   forming a disposable gate structure on a semiconductor substrate;
   removing the disposable gate structure, the removing forming a gate cavity;
   forming a first dielectric layer in the gate cavity;
   forming a second dielectric layer in the gate cavity;
   forming a first metal nitride layer on the second dielectric layer; and
   diffusing dopants from the second dielectric layer into a portion of the first dielectric layer.

2. The method of claim 1, further comprising:
   before removing the disposable gate structure, forming a gate spacer on sidewalls of the disposable gate structure, wherein inner sidewalls of the gate spacer are exposed after removing the disposable gate structure.

3. The method of claim 2, wherein forming the disposable gate structure comprises:
   forming a disposable gate dielectric;
   forming a disposable gate material on the disposable gate dielectric; and
   forming a disposable gate cap dielectric on the disposable gate material.

4. The method of claim 2, further comprising:
   forming a second metal nitride layer on the first metal nitride layer; and
   after forming the second metal nitride layer, filling the gate cavity with a conductive material.

5. The method of claim 4, wherein the conductive material comprises a first work function metallic layer.

6. The method of claim 5, further comprising:
   after forming the second metal nitride layer and before filling the gate cavity with the conductive material, forming a second work function metallic layer on the second metal nitride layer, the second work function metallic layer comprising a different work function type than the first work function metallic layer.

7. The method of claim 1, wherein the first dielectric layer comprises one of $HfO_2$ and $ZrO_2$.

8. The method of claim 7, wherein the second dielectric layer comprises a dielectric material including one of:
  at least one group IIA element, and
  at least one group IIIB element.

9. The method of claim 1, further comprising forming an interfacial layer on the semiconductor substrate, the first dielectric layer being formed on the interfacial layer.

* * * * *